(12) United States Patent
Kunikiyo

(10) Patent No.: US 6,303,483 B1
(45) Date of Patent: Oct. 16, 2001

(54) METHOD OF MANUFACTURING SEMICONDUCTOR DEVICE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/755,119

(22) Filed: Jan. 8, 2001

(30) Foreign Application Priority Data

Jun. 30, 2000 (JP) .................................................. 12-198360

(51) Int. Cl.$^7$ .............................................. H01L 21/3205
(52) U.S. Cl. ............................................................ 438/592
(58) Field of Search ................................... 438/592, 595, 438/643, 648, 656, 663, 680, 683, 685

(56) References Cited

U.S. PATENT DOCUMENTS

| | | | |
|---|---|---|---|
| 5,733,816 | * 3/1998 | Iyer et al. | 438/592 |
| 6,001,718 | 12/1999 | Katata et al. | 438/592 |
| 6,040,021 | * 3/2000 | Miyamoto | 427/576 |
| 6,187,656 | * 2/2001 | Lu et al. | 438/592 |
| 6,218,311 | * 4/2001 | McKee et al. | 438/719 |

FOREIGN PATENT DOCUMENTS

| | | |
|---|---|---|
| 6-204171 | 7/1994 | (JP) . |
| 11-233451 | 8/1999 | (JP) . |

OTHER PUBLICATIONS

Byung Hak Lee, et al., "In–Situ Barrier Formation for High Reliable W/Barrier/Poly–Si Gate Using Denudation of $Wn_x$ on Polycrystalline Si," IEDM, 1998, pp. 385–388.

* cited by examiner

Primary Examiner—David Nelms
Assistant Examiner—Quoc Hoang
(74) Attorney, Agent, or Firm—Oblon, Spivak, McClelland, Maier & Neustadt, P.C.

(57) ABSTRACT

A polycrystalline or amorphous silicon film is formed on the surface of a semiconductor substrate through a gate insulator film. The surface of the silicon film is so exposed to the outside air that a native oxide film is formed thereon. A barrier film consisting of a metal nitride containing added reducing metal atoms reducing the native oxide film is formed on the silicon film through the native oxide film. A metal film is formed on the barrier film, while another barrier film and an insulator film are successively deposited on the metal film. When heat treating a gate electrode deposited in the aforementioned manner, the native oxide film is reduced by the reducing metal atoms to disappear, while nitrogen atoms resulting from the metal nitride thermally decomposed in the barrier film react with the reducing metal atoms to form a barrier metal. Thus provided are a method of manufacturing a semiconductor device and a semiconductor device capable of preventing a polymetal gate electrode from increase of sheet resistance and refining the gate electrode also when performing heat treatment thereon.

9 Claims, 12 Drawing Sheets

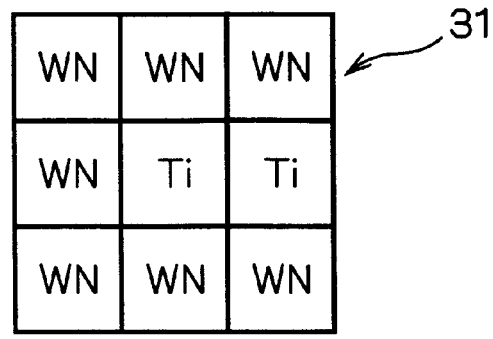
F I G. 1 2
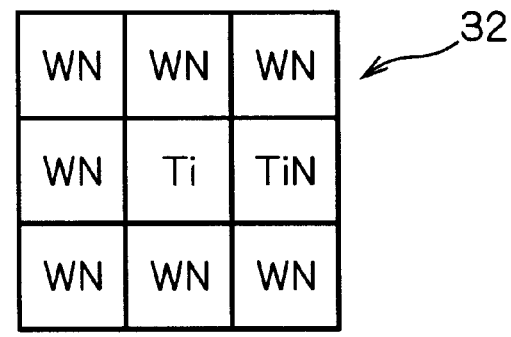
F I G. 1 3
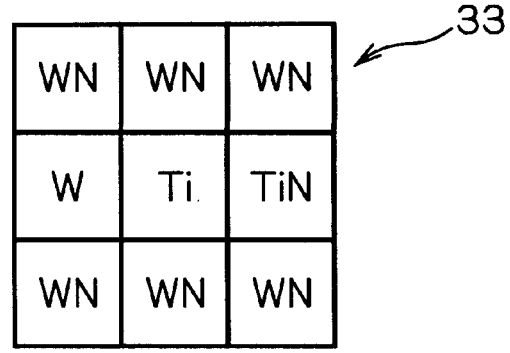
F I G. 1 4

FIG. 15
| Ti | W | W |
|----|---|---|
| W | Ti | W |
| W | W | Ti |
34
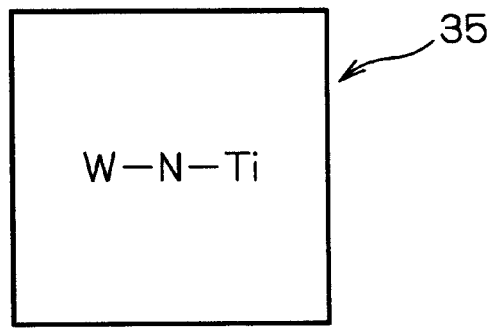
FIG. 16
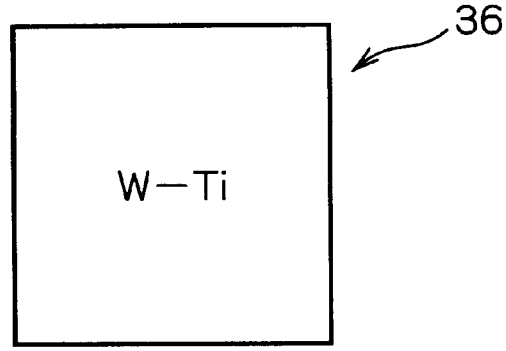
FIG. 17

METHOD OF MANUFACTURING SEMICONDUCTOR DEVICE

BACKGROUND OF THE INVENTION

1. Field of the Invention

The present invention relates to the structure of a gate electrode of a semiconductor device such as a field-effect transistor (FET) having a MOS (metal-oxide-semiconductor) structure.

2. Description of the Background Art

Refinement of a field-effect transistor (hereinafter referred to as "MOSFET") having a MOS structure progresses in recent years. This results in such a problem that thin wire resistance or contact resistance of a gate electrode is increased as the gate length of the gate electrode is reduced, for example. When the thin wire resistance or the contact resistance is increased, the circuit operating speed is disadvantageously slowed down while the number of memory cells capable of sharing a single word line is reduced, the number of divided word lines is increased and the number of peripheral circuits is also increased, leading to an increase of the chip area in a memory such as a DRAM (dynamic random-access memory). When the chip area is increased, the theoretical chip number per wafer is reduced to increase the production cost and reduce the price competitiveness of the chip. Therefore, reduction of the thin wire resistance or the contact resistance, leading to implementation of refinement of the semiconductor device and reduction of the chip area, are important development items in the semiconductor industry.

A gate electrode of a conventional MOSFET is formed by a single-layer electrode consisting of only polysilicon containing an impurity element added in high concentration or a multilayer electrode of a metal silicide/polysilicon structure having relatively small gate resistance, represented by a $WSi_x$ (x=2.4 to 2.8)/polysilicon structure or a $CoSi_2$/polysilicon structure. However, it is difficult to apply the conventional gate electrode having such a structure to a transistor having a fine pattern of not more than 0.12 µm, for example. This is because the thin wire resistance or the contact resistance of the gate electrode is excessively increased when the gate electrode is refined.

Therefore, a polymetal gate electrode having lower resistance than the conventional gate electrode is watched with interest. For example, Japanese Patent Application Laid-Open No. 11-233451 (1999) discloses a general polymetal gate electrode.

FIG. 21 is a model diagram showing a sectional structure of a conventional polymetal gate electrode 106. The gate electrode 106 is formed by successively depositing a polysilicon film 102, a barrier metal film 103, a metal film 104 and an insulator film 105 on the main surface of a silicon substrate 100 through a gate insulator film 101. The barrier metal film 103 consists of tungsten nitride (WN) or titanium nitride (TiN), and the metal film 104 consists of tungsten or the like. The polysilicon film 102 is doped with an impurity element in high concentration. This impurity element is prepared from an n-type dopant such as phosphorus or arsenic when forming an NMOSFET (n-channel MOSFET) or from a p-type dopant such as boron or indium when forming a PMOSFET (p-channel MOSFET). A polymetal gate electrode structure stands for such a three-layer structure of a metal film, a barrier metal film and a polysilicon film. When no barrier metal film 103 is interposed between the polysilicon film 102 and the metal film 104, polysilicon thermally diffusing from the polysilicon film 102 reacts with metal atoms contained in the metal film 104 to form metal silicide and disadvantageously increase the resistance of the gate electrode 106 when the gate electrode 106 is heat-treated after deposition.

FIGS. 22 and 23 illustrate concentration distribution of various types of elements contained in the polysilicon film 102, the barrier metal film 103 and the metal film 104 when the metal film 104 consists of W and the barrier metal film 103 consists of $WN_x$ as first prior art of such a polymetal gate electrode. Referring to FIGS. 22 and 23 illustrating the concentration distribution along the line A1-A2 in FIG. 21, FIG. 22 shows the concentration distribution immediately after depositing the barrier metal film 103 and the metal film 104, and FIG. 23 shows the concentration distribution after heat-treating the gate electrode 106 in a later step. Referring to each of FIGS. 22 and 23, the horizontal axis shows the distance, and the vertical axis shows the logarithmic scale values of atom numbers per unit cubic centimeter. As the heat treatment, RTA (rapid thermal annealing) is carried out at 1000° C.

Referring to FIG. 22, nitrogen atoms (N) and tungsten atoms (W) are substantially homogeneously distributed in the barrier metal film 103 before the heat treatment. After the heat treatment, on the other hand, tungsten nitride ($WN_x$) contained in the barrier metal film 103 decomposes into tungsten atoms (W) and nitrogen atoms (N) due to the RTA, and the nitrogen atoms partially evaporate as nitrogen molecules, partially segregate toward the metal film 104 and partially form $W_2N$, which is a conductor having lower resistance than $WN_x$. It is understood from FIG. 23 that the concentration distribution of silicon atoms (Si) shifts into the barrier metal film 103 due to the heat treatment and the silicon atoms diffuse into the barrier metal film 103 from the polysilicon film 102. Hence, it is conceivable that such diffusing Si reacts with W and N in the barrier metal film 103 to form an insulator such as silicon nitride (SiN) or WSiN and tungsten silicide ($WSi_x$) having higher resistance than a high melting point metal such as W or Mo. Thus, there is a possibility that the resistance (sheet resistance and contact resistance) of the barrier metal film 103 is increased.

An example employing W for the metal film 104 and two layers of TiN and Ti for the barrier metal film 103 is also proposed as second prior art of the polymetal gate electrode. In conventional manufacturing steps, the polysilicon film 102, the barrier metal film 103 and the metal film 104 are generally deposited on the overall surface of the silicon substrate 100 through the gate insulator film 101 and thereafter the insulator film 105 of silicon nitride or silicon oxynitride is deposited and the gate electrode 106 is formed by anisotropic etching employing photolithography.

Further, high-temperature heat treatment is performed on the gate electrode 106 in a diluted oxygen atmosphere for forming oxide films on the side walls thereof, in order to recover the gate electrode 106 from damages resulting from the aforementioned anisotropic etching. In this high-temperature heat treatment, titanium and polysilicon react with each other in the barrier metal film 103 to form metal silicide ($TiSi_x$). This metal silicide diffuses into the polysilicon film 102 and reaches the gate insulator film 101 during the aforementioned high-temperature heat treatment to remarkably deteriorate the insulation property of the gate insulator film 102 or forms crystal grains and segregates in the polysilicon film 102 to remarkably increase the resistance of the polysilicon film 102 if not reaching the gate insulator film 102.

The aforementioned problems of the conventional polymetal gate are summarized as follows:

(1) As described with reference to the first prior art, it is apprehended that Si diffuses from the polysilicon film 102 into the barrier film 103 and the diffusing Si reacts with W and N in the barrier film 103 to form SiN, $WSi_x$ or WSiN in the heat treatment after deposition of the gate electrode 106, to disadvantageously increase the resistance of the barrier metal film 103.

(2) As described with reference to the second prior art, titanium reacts with polysilicon in the step of performing the high-temperature heat treatment on the gate electrode 106 to form metal silicide $TiSi_x$, which disadvantageously deteriorates the characteristics of the gate insulator film 101 and extremely increases the sheet resistance of the gate electrode 106 when the barrier metal film 103 is prepared from TiN and Ti.

Further, the following problem is common to the first prior art and the second prior art:

(3) In general, the native oxide film formed on the surface of the polysilicon film 102 is removed with a chemical solution of hydrogen fluoride or the like before depositing the barrier metal film 103 by sputtering or the like. However, the native oxide film cannot be completely removed but remains and hence the interfacial resistance between the barrier metal film 103 and the polysilicon film 102 cannot be reduced to an intended degree due to the remaining native oxide film.

SUMMARY OF THE INVENTION

In a method of manufacturing a semiconductor device comprising a gate electrode having a layered product of a polysilicon film, a barrier film and a metal film on a semiconductor substrate through a gate insulator film, according to a first aspect of the present invention, manufacturing steps for the gate electrode comprise steps of (a) forming a polycrystalline or amorphous silicon film on the surface of the semiconductor substrate through the gate insulator film, (b) forming the barrier film of a metal nitride containing added reducing metal atoms reducing a silicon oxide film which is a natural oxide film on the silicon film through the silicon oxide film, (c) forming the metal film on the barrier film and (d) executing heat treatment after carrying out the steps (a) to (c).

In the method of manufacturing a semiconductor device according to the first aspect, as hereinabove described, the native oxide film interposable between the silicon film and the barrier film is reduced by the reducing metal atoms to disappear through the heat treatment in the step (d). In this heat treatment, further, nitrogen atoms resulting from decomposition of the metal nitride contained in the barrier film react with the reducing metal atoms to form a barrier metal, thereby inhibiting silicon atoms from diffusing into the barrier film from the silicon film and forming a silicon compound of high resistance. Therefore, the gate electrode can be reduced in resistance, and refined.

According to a second aspect of the present invention, the method of manufacturing a semiconductor device adds a reducing metal having an enthalpy of formation of an oxide higher than an enthalpy of formation of the silicon oxide film into the barrier film in the step (b).

According to the second aspect, the oxide of the reducing metal atoms has higher thermodynamic stability than a native oxide, whereby reductive reaction of the native oxide by the reducing metal atoms is dominant and an effect of removing the native oxide can be improved.

According to a third aspect of the present invention, the method of manufacturing a semiconductor device employs atoms of at least one metal selected from titanium, molybdenum, tantalum, niobium, vanadium and chromium as the reducing metal atoms in the step (b).

When employing the reducing metal atoms according to the third aspect, reductive reaction of the natural oxide can be more reliably progressed.

According to a fourth aspect of the present invention, the method of manufacturing a semiconductor device employs titanium atoms as the reducing metal atoms and sets the content of the reducing metal atoms in the barrier film within the range of 1 to 60 atomic %.

According to a fifth aspect of the present invention, the method of manufacturing a semiconductor device employs atoms of at least one metal selected from molybdenum, tantalum, niobium, vanadium and chromium as the reducing metal atoms and sets the content of the reducing metal atoms in the barrier film within the range of 1 to 30 atomic %.

When adjusting the content of the reducing metal atoms in the numerical range according to the fourth or fifth aspect, reductive reaction of the native oxide film can be progressed so that the native oxide film substantially disappears while the quantity of residual unreacted reducing metal atoms neither contributing to the reductive reaction nor reacting with the nitrogen atoms resulting from decomposition of the metal nitride can be reduced. Therefore, the unreacted reducing metal atoms can be prevented from reacting with silicon thermally diffusing from the silicon film and forming metal silicide. Thus, reduction of the resistance of the gate electrode and refinement of the gate electrode can be reliably attained.

According to a sixth aspect of the present invention, the method of manufacturing a semiconductor device employs tungsten nitride as the metal nitride forming the barrier film in the step (b).

According to the sixth aspect, the absolute value of the enthalpy of formation of the oxide of tungsten is relatively low and hence reductive reaction of the native oxide with the reducing metal atoms can be advantageously progressed.

According to a seventh aspect of the present invention, the method of manufacturing a semiconductor device deposits the barrier film by sputtering employing a target formed by mosaically arranging a plurality of target materials in the step (b).

According to the seventh aspect, combination of the target materials may be selected or changed in response to a desired composition of the barrier film, whereby the composition of the barrier film can be simply controlled and the content of the reducing metal atoms in the barrier film can be readily adjusted.

According to an eighth aspect of the present invention, the method of manufacturing a semiconductor device introduces argon into the barrier film in the step (b).

According to the eighth aspect, argon increases thermal stability of the barrier film for preventing silicon or an impurity element from diffusing into the barrier film from the silicon film and increasing the resistance of the gate electrode when executing heat treatment in the step (d), whereby a gate electrode having lower resistance can be implemented.

According to a ninth aspect of the present invention, the method of manufacturing a semiconductor device introduces the reducing metal atoms and nitrogen atoms into the barrier film to form a peak of concentration distribution in the vicinity of the interface between the barrier film and the silicon film after forming the barrier film in the step (b).

According to the ninth aspect, the concentration of titanium nitride is increased in the barrier film when executing heat treatment in the step (d), whereby the performance of the barrier film can be improved.

An object of the present invention is to provide a method of manufacturing a semiconductor device and a semiconductor device capable of preventing a polymetal gate electrode from increase of sheet resistance and refining the gate electrode also when performing heat treatment thereon.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 illustrates an exemplary target consisting of tungsten nitride and titanium;

FIG. 13 illustrates an exemplary target consisting of tungsten nitride, titanium and titanium nitride;

FIG. 14 illustrates an exemplary target consisting of tungsten nitride, tungsten, titanium and titanium nitride;

FIG. 15 illustrates an exemplary target consisting of tungsten and titanium;

FIG. 16 illustrates an exemplary target consisting of a tungsten-nitrogen-titanium alloy;

FIG. 17 illustrates an exemplary target consisting of a tungsten-titanium alloy;

DESCRIPTION OF THE PREFERRED EMBODIMENTS

Figure 1:
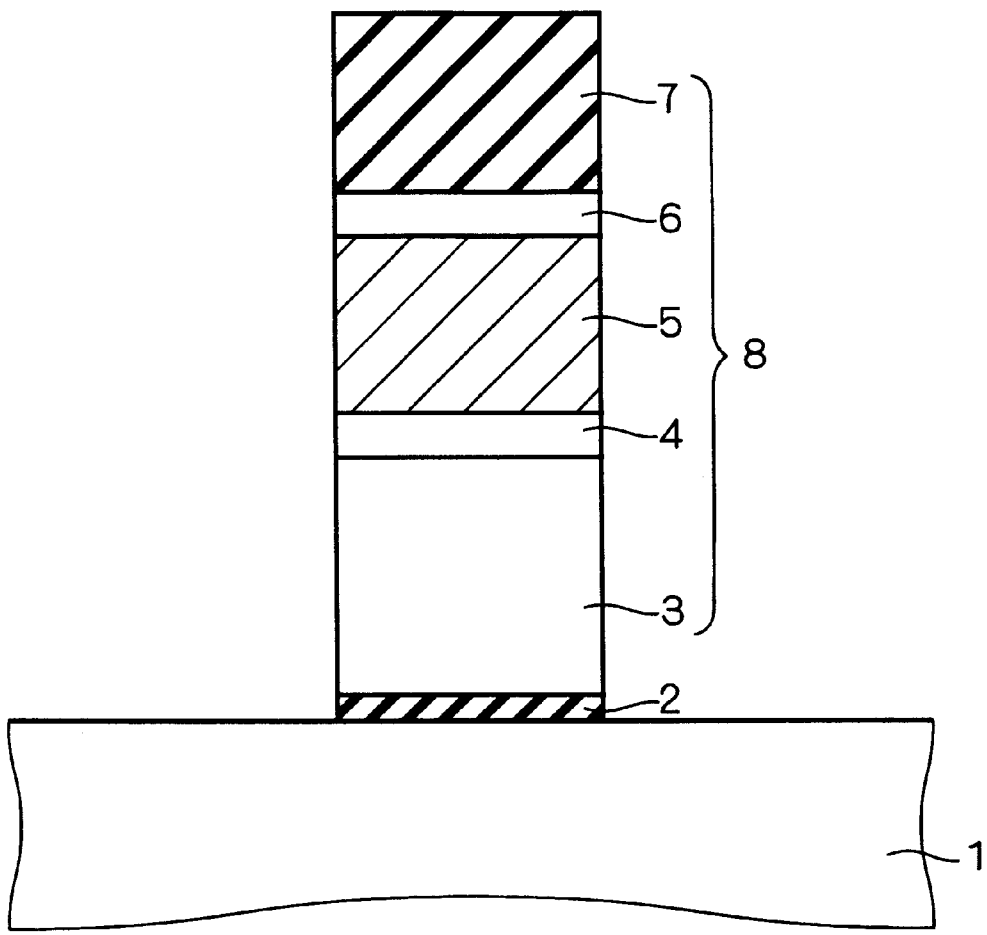
FIG. 1 is a model diagram showing a sectional structure of a gate electrode according to an embodiment of the present invention.

FIG. 1 is a model diagram showing a sectional structure of a gate electrode 8 according an embodiment of the present invention. The gate electrode 8 shown in FIG. 1 is formed by successively depositing a polysilicon film 3 doped with an impurity element in high concentration, a barrier film 4, a metal film 5 of a high melting point metal or the like, a barrier film 6 and an insulator film 7 on the main surface of a p- or n-type silicon semiconductor substrate 1 through a gate insulator film 2.

The barrier film 4 interposed between the polysilicon film 3 and the metal film 5 consists of a barrier metal such as tungsten nitride containing reducing metal atoms of titanium or the like reducing a silicon oxide by heat treatment. The reducing metal atoms may be prepared from molybdenum (Mo), tantalum (Ta), niobium (Nb), vanadium (V) or chromium (Cr), in place of titanium (Ti). Such reducing metal atoms are contained in the barrier film 4 as a nitride or an oxide, and the oxide preferably has high thermodynamic stability due to a larger absolute value of an enthalpy ΔH of formation as compared with a silicon oxide as described later.

The barrier film 6 consists of a barrier metal such as TiN, while the insulator film 7 may be prepared from silicon oxide, silicon oxynitride, silicon nitride, TEOS (tetraethyl orthosilicate) or BPTEOS (borophospho TEOS).

An embodiment of a method of manufacturing a semiconductor device having such a gate electrode 8 is now described in detail with reference to FIGS. 2 to 11.

Figure 2:
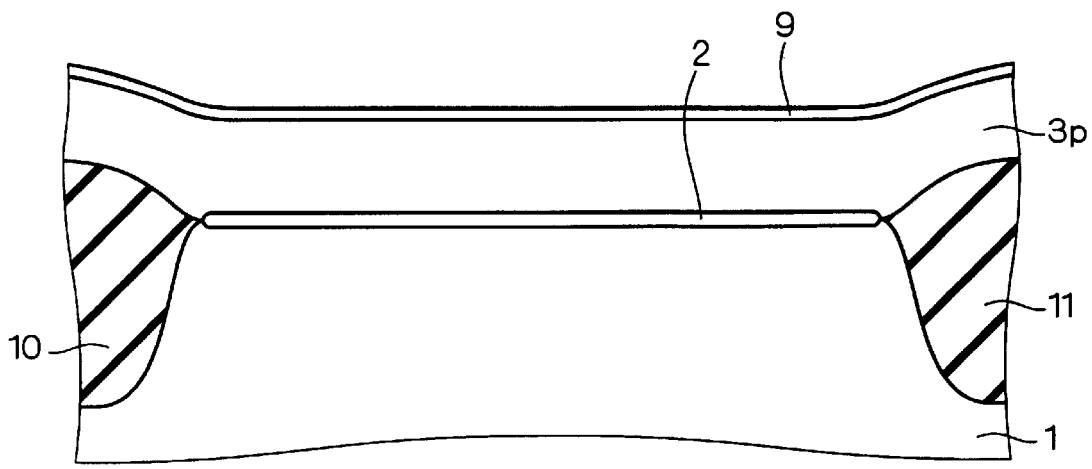
FIGS. 2 to 11 are model diagrams for illustrating steps of a method of manufacturing a semiconductor device according to the embodiment.

As shown in FIG. 2, the p- or n-type silicon semiconductor substrate 1 is first prepared and element isolation regions 10 and 11 are formed on both end portions of an active region. The element isolation regions 10 and 11 may be formed by a well-known technique. Exemplary well-known element isolation methods are a LOCOS (local oxidation of silicon) method employing an oxidation-resistant silicon nitride film as a mask material for selectively thickly oxidizing a region of the silicon semiconductor substrate 1 not covered with the silicon nitride film and forming element isolation regions of isolation oxide films or an SILO (sealed interface local oxidation) method, for example. An STI (shallow trench isolation) method is employed as an element isolation method advantageous in the point of refinement in particular. In this STI method, trench openings are formed in the silicon semiconductor substrate 1 by etching or the like and insulator films are embedded in the trench isolation openings by HDP-CVD (high density plasma chemical vapor deposition) or the like thereby forming element isolation regions.

Then, the main surface of the silicon semiconductor substrate 1 is oxidized for forming the gate insulator film 2, and a polycrystalline or amorphous silicon film 3p having a thickness of 10 nm to 100 nm, more preferably 20 nm to 40 nm is deposited on the gate insulator film 2 by CVD or the like. The surface of the silicon film 3p is exposed to the outside air, to result in formation of a native oxide film 9 on this surface. When depositing an amorphous silicon film as the silicon film 3p, the amorphous silicon film is crystallized into a polysilicon film in a later high-temperature heat treatment step.

Then, mask patterning is executed for selectively ion-implanting an impurity into a gate electrode forming region of the silicon film 3p. Boron or indium may be introduced into the silicon film 3p as the impurity when preparing a PMOSFET, while phosphorus may be introduced into the silicon film 3p as the impurity when preparing an NMOS-FET. Then, the native oxide film 9 formed on the surface of the silicon film 3p is removed. More specifically, etching is performed with a chemical solution of hydrogen fluoride or the like or sputtering is performed under an argon atmosphere, while the native oxide film 9 is not completely removed but remains.

Figure 3:
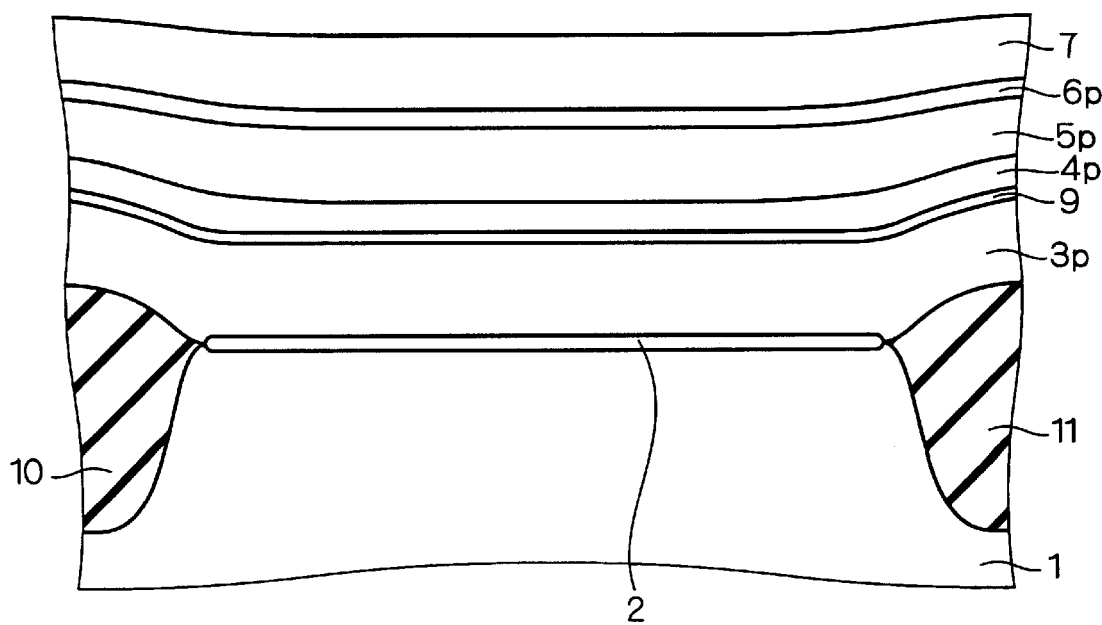

Then, a barrier film 4p of a metal nitride such as tungsten nitride ($WN_x$) containing the aforementioned reducing metal atoms is deposited on the native oxide film 9 by sputtering or the like, as shown in FIG. 3. The thickness of the barrier film 4p is preferably adjusted within the range of 2 nm to 10 nm, particularly within the range of 3 nm to 7 nm. Then, a metal film 5p of a high melting point metal such as tungsten is deposited on the barrier film 4p by sputtering or the like. The thickness of the metal film 5p is preferably adjusted within the range of 10 nm to 100 nm, particularly within the range of 20 nm to 60 nm.

The barrier film 4p formed on the silicon film 3p is in an amorphous state immediately after the deposition. When depositing a polysilicon film as the silicon film 3p, crystal grains contained in the polysilicon film are oriented in various crystallographic directions, and the barrier film 4p formed on this polysilicon film is influenced by the crystal orientations. When the barrier film 4p is crystallized by the heat treatment described later, therefore, crystallinity of the barrier film is hardly homogenized in the vicinity of the interface between the crystallized barrier film and the polysilicon film. When depositing an amorphous silicon film as the silicon film 3p, on the other hand, the amorphous silicon film and the amorphous barrier film 4p, formed thereon are polycrystallized in the heat treatment described later, whereby the crystallinity of the crystallized barrier film is readily homogenized in the vicinity of the interface between these films. When selecting the amorphous silicon film as the silicon film 3p, therefore, sheet resistance of the gate electrode 8 can be suppressed low as compared with the case of selecting a polysilicon film.

FIGS. 12 to 17 illustrate exemplary preferable targets employed in the sputtering for depositing the barrier film 4p. Each figure shows symbols of metal elements forming target materials. Referring to each of FIGS. 12 to 15, nitride alloy regions and simple metal regions are mosaically arranged in three rows and three columns. FIG. 12 shows a target 31 formed by combination of seven tungsten nitride (WN) regions and two titanium (Ti) regions, FIG. 13 shows a target 32 formed by combination of seven tungsten nitride (WN) regions, a titanium nitride (TiN) region and a titanium (Ti) region, and FIG. 14 shows a target 33 formed by combination of six tungsten nitride (WN) regions, a titanium nitride (TiN) region, a titanium (Ti) region and a tungsten (W) region.

FIG. 15 shows a target 34 prepared by arranging six tungsten (W) regions and three titanium (Ti) regions with no alloy region of WN or TiN. In the case of this target 34, the barrier film 4p is formed by reactive sputtering for forming a compound thin film of the target materials while adjusting the partial pressure of active gas under an atmosphere of a gas mixture of active gas of nitrogen and argon. The composition of the barrier film 4p can be so controlled that the content of the reducing metal atoms in the barrier film 4p can be readily adjusted by mosaically arranging a plurality of target materials and adjusting the ratios occupied by the respective target materials on the surface area.

FIG. 16 shows a target 35 consisting of a W—N—Ti alloy. FIG. 17 shows a target 36 consisting of a W—Ti alloy, which is used along with reactive sputtering employing active gas of nitrogen for forming a nitride, similarly to the case of the aforementioned target 34 shown in FIG. 15.

While all targets shown in FIGS. 12 to 17 are in the form of squares, the present invention is not restricted to this but the target may have a rectangular or circular shape.

The barrier film 4p may alternatively be formed by supplying material gas onto the surface of the aforementioned native oxide film 9 by PECVD (plasma enhanced chemical vapor deposition) in place of the aforementioned sputtering and causing chemical reaction in the vicinity of the surface of the native oxide film 9. The material gas can be prepared from a mixture of $WF_6$, $TiCl_4$, $H_2$, $N_2$ and Ar. In this mixture, a chloride of titanium represented by $TiCl_4$ may be replaced with a nitride or a fluoride of titanium. The content of the reducing metal atoms in the barrier film 4p can be controlled by adjusting the flow rate of such material gas.

In order to prevent the gate electrode 8 from increase of the resistance, argon is preferably added to the barrier film 4p. When introducing argon into barrier film 4p, atoms forming the barrier film 4p hardly move in the film in the high-temperature heat treatment step described later, to increase thermal stability of the barrier film 4p. Further, silicon or the impurity element is prevented from diffusing into the barrier film 4p from the silicon film 3p in the high-temperature heat treatment step described later. Metal silicide is formed in the barrier film 4p when silicon diffuses from the silicon film 3p into the barrier film 4p while the impurity element concentration in the silicon film 3p is reduced in the vicinity of the interface between the barrier film 4p and the silicon film 3p when the impurity element diffuses from the silicon film 3p into the barrier film 4p, to increase the resistance of the gate electrode 8 in each case. Argon may be introduced into the barrier film 4p when forming the barrier film 4p by the aforementioned sputtering or PECVD, or may be ion-implanted into the barrier film 4p after forming the barrier film 4p.

Then, a barrier film 6p of a barrier metal such as titanium nitride (TiN) is formed on the metal film 5p by sputtering. The thickness of the barrier film 6p is adjusted within the range of 2 nm to 10 nm, more preferably within the range of 3 nm to 7 nm. Then, the insulator film 7 of silicon nitride or the like is deposited on the barrier film 6p by an LPCVD (low-pressure CVD) apparatus or a PECVD apparatus.

The barrier film 6p is interposed between the metal film 5p and the insulator film 7 in order to improve adhesion between the insulator film 7 and the metal film 5p not to separate from each other and prevent metal atoms contained in the metal film 5p from diffusing into the insulator film 7 and reducing the insulation property of the insulator film 7 in the high-temperature heat treatment described later. The barrier film 4p, the metal film 5p and the barrier film 6p are in amorphous states in formation. The barrier film 4p, the metal film 5p and the barrier film 6p are crystallized through the step of depositing the insulator film 7 and the high-temperature heat treatment step described later.

Figure 4:
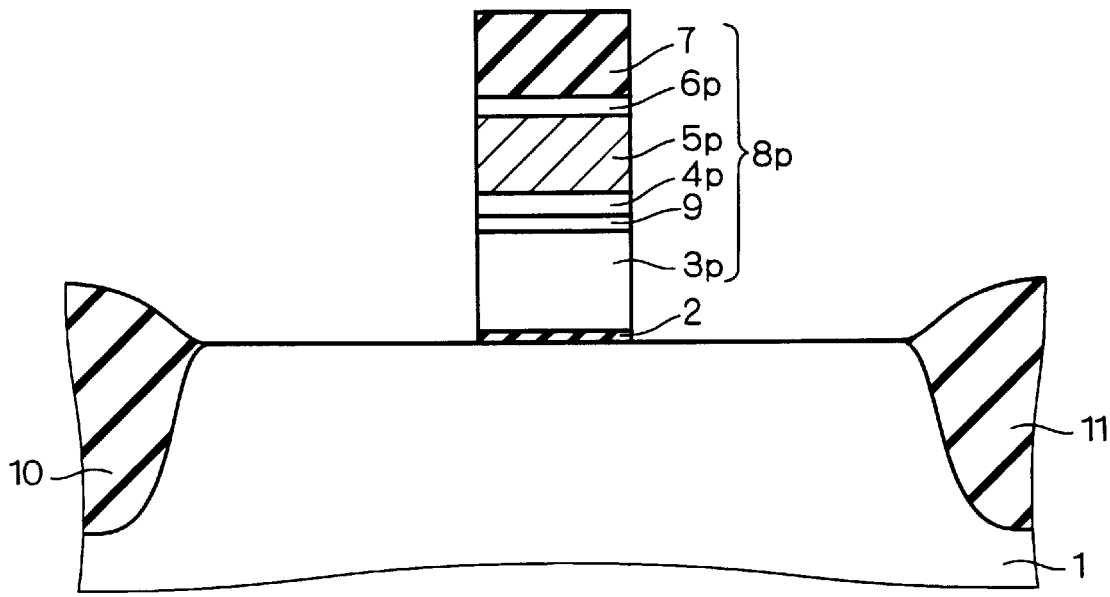

Then, resist patterning is performed for carrying out anisotropic etching, thereby forming a gate electrode 8p as shown in FIG. 4. In this anisotropic etching, the side walls of the gate electrode 8p and the gate insulator film 2 and the surface of the silicon semiconductor substrate 1 are damaged. Such damages are removed along with an oxide film formed in a selective oxidation step described later. The insulator film 7 serves as an antireflection coating (ARC) for preventing halation caused by light reflected by the underlayer metal film 5p when exposing a resist surface in the resist patterning step. The resist may be either positive or negative. After termination of the anisotropic etching, the resist (not shown) employed as a mask is separated/removed.

Figure 5:
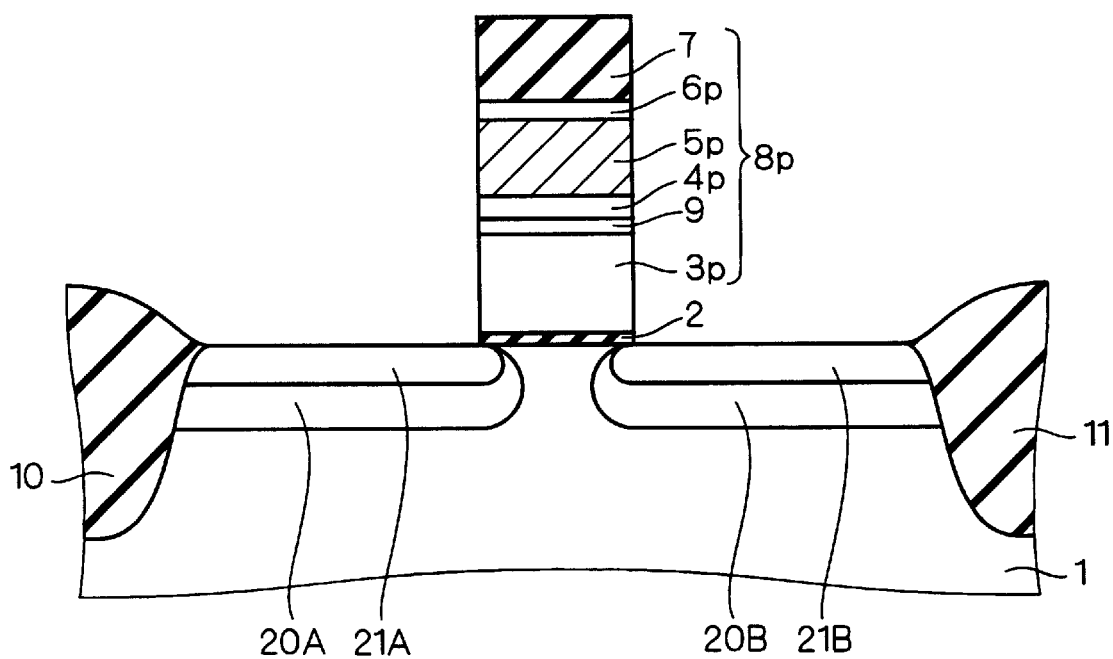

Then, the gate electrode 8p is employed as a mask for ion-implanting an impurity into the silicon semiconductor substrate 1 thereby forming extension regions 21A and 21B in a self-aligned manner, and ion implantation is further performed for forming pocket regions 20A and 20B having the same polarity as and higher impurity concentration than the silicon semiconductor substrate 1 under the extension regions 21A and 21B, as shown in FIG. 5. The types of the impurity elements introduced into the extension regions 21A and 21B and the pocket regions 20A and 20B are n- and p-types respectively when preparing an NMOSFET, and p- and n-types respectively when preparing a PMOSFET. Phosphorus, arsenic or antimony may be employed as an n-type impurity element, while boron or indium may be employed as a p-type impurity element. Means of forming the extension regions 21A and 21B and the pocket regions 20A and 20B, which are diffusion layers for mainly suppressing a short-channel effect, is not restricted to ion implantation but another well-known means such as plasma doping or a cluster ion beam method may alternatively be employed.

Then, the surface of the silicon semiconductor substrate 1 and the side walls of the gate electrode 8p and the gate insulator film 2 are selectively oxidized for forming an oxide film (not shown). Due to this selective oxidation step, the damages caused on the side walls of the gate electrode 8p and the gate insulator film 2 and the surface of the silicon semiconductor substrate 1 in the aforementioned anisotropic etching can be transferred into the oxide film while crystallinity of regions of the silicon semiconductor substrate 1, having the pocket regions 20A and 20B and the extension regions 21A and 21B, irradiated with ions can be recovered. When the metal film 5p consists of tungsten readily oxidized in an oxidation atmosphere of at least about 350° C., an $H_2O$ partial pressure may be limited to about $10^{-10}$ to $10^{-3}$ of an $H_2$ partial pressure under an $H_2O/H_2$ atmosphere within the temperature range of 800° C. to 1200° C., for example, so that only silicon can be selectively oxidized. The $H_2O/H_2$ atmosphere may be replaced with an $N_2O/H_2$ atmosphere or an $NO/H_2$ atmosphere.

Figure 6:
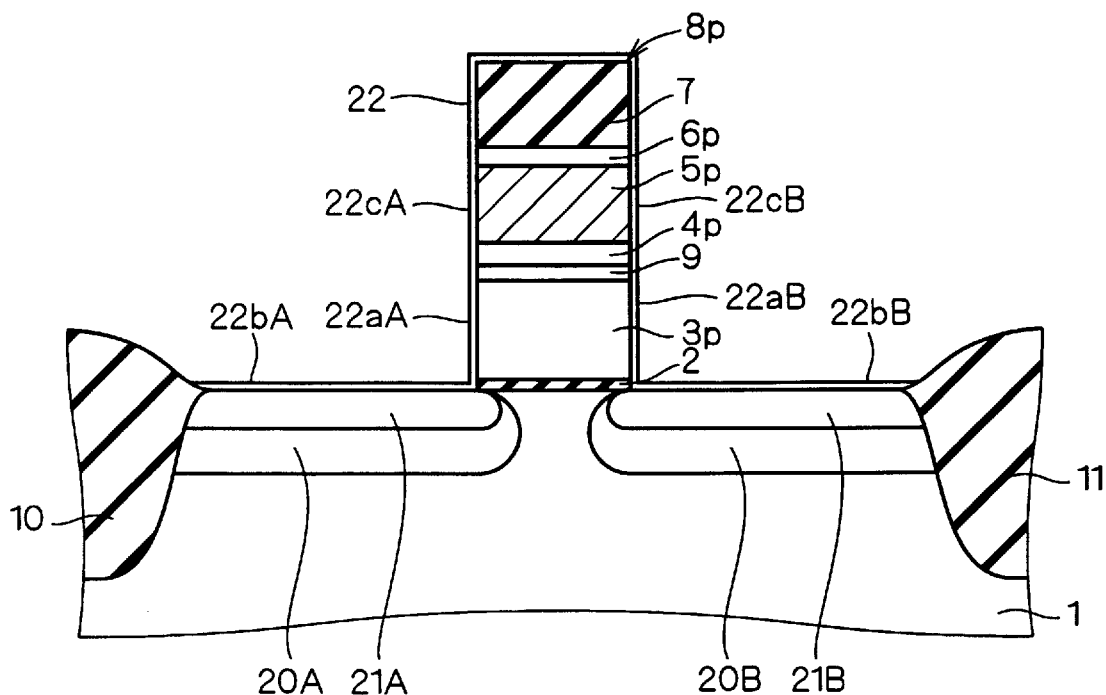

Then, an annealing step is carried out. More specifically, RTA is executed under an $N_2$ atmosphere at about 700° C. to 1200° C., for forming a nitride film 22 on the surfaces of the silicon semiconductor substrate 1 and the gate electrode 8p as shown in FIG. 6. In this nitride film 22, silicon nitride films 22aA, 22bA and 22bB are formed on the side walls of the silicon film 3p and the surface of the silicon semiconductor substrate 1, and metal nitride films 22cA and 22cB are formed on the side walls of the metal film 5p. The silicon nitride films 22aA and 22aB formed on the side walls of the silicon film 3p prevent the silicon film 3p from being oxidized beyond necessity and prevent gate resistance from being increased in a next oxidation step.

Figure 7:
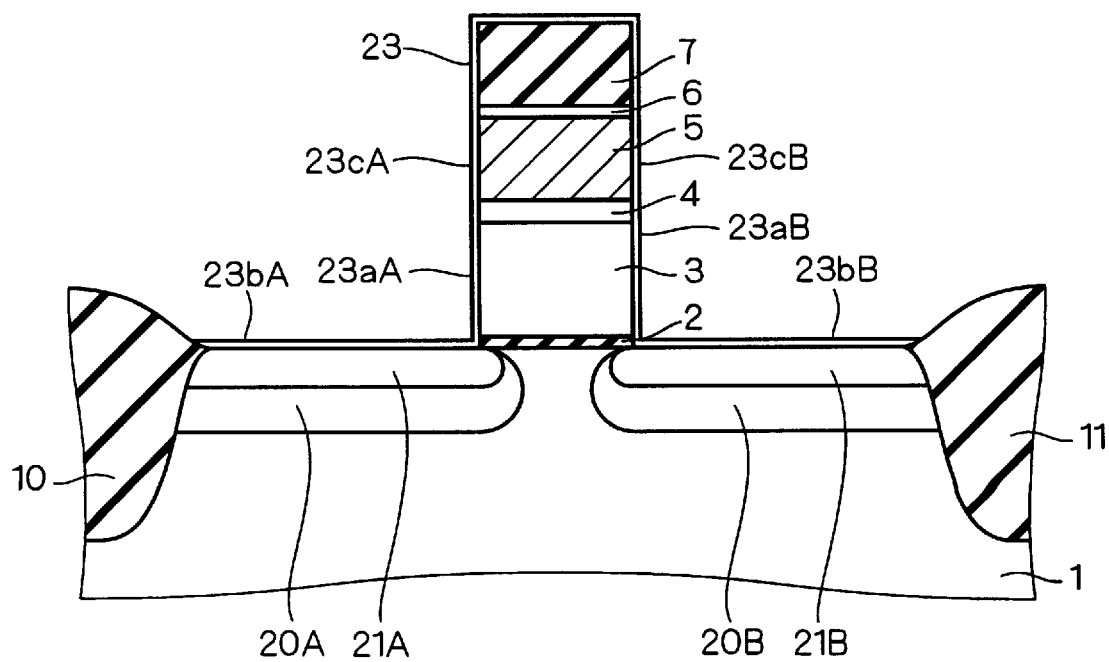

Then, the oxidation step is carried out. More specifically, RTO (rapid thermal oxidation) is executed at 800 to 1200° C. by rapid annealing under an $H_2O/H_2$ atmosphere, for example, for oxidizing the nitride film 22 and forming an oxynitride film 23, as shown in FIG. 7. In this oxynitride film 23, silicon oxynitride films 23aA, 23aB, 23bA and 23bB are formed on the side walls of the silicon film 3 and the surface of the silicon semiconductor substrate 1, and metal oxynitride films 23cA and 23cB are formed on the side walls of the metal film 5. This RTO is executed under selective oxidation conditions, so as not to oxidize tungsten forming the metal film 5. Further, the silicon nitride films 22aA and 22aB are formed on the side walls of the silicon film 3p by RTA in the annealing step preceding the oxidation step, whereby the silicon film 3p is protected by the silicon nitride films 22aA and 22aB and prevented from remarkable oxidation. Thus, it is possible to avoid such a problem that the silicon film 3p is shortened along the gate length to increase the resistance of the gate electrode 8p and increase a circuit delay time.

Thus, through the high-temperature heat treatment step formed by the annealing step and the oxidation step, a metal nitride such as $WN_x$ forming the barrier film 4p decomposes while part of the reducing metal atoms contained in the barrier film 4p reduces the native oxide film 9 and the remaining part reacts with the nitrogen atoms of the decomposing metal nitride to form a barrier metal such as titanium nitride (TiN). Such a barrier metal prevents polysilicon contained in the silicon film 3p from interdiffusing and reacting with the metal contained in the metal film 5p and forming metal silicide. Thus, the interfacial resistance between the silicon film 3 and the barrier film 4 is suppressed. When depositing an amorphous silicon film as the silicon film 3p, the amorphous silicon film is polycrystallized into a polysilicon film through the aforementioned high-temperature heat treatment step.

When a number of unreacted reducing metal atoms neither contributing to reductive reaction of the native oxide film 9 nor forming a barrier metal in the high-temperature heat treatment step are present in the barrier film 4p, the unreacted reducing metal atoms react with thermally diffusing silicon atoms to form metal silicide such as $TiSi_x$ or $MoSi_x$. This type of metal silicide unpreferably passes through the silicon film 3p and diffuses into the gate insulator film 2 to deteriorate the characteristics of the gate insulator film 2. Thus, it is preferable to regulate the content of the reducing metal atoms in the barrier film 4p. More specifically, the concentration of Ti atoms contained in the barrier film 4 is preferably within the range of 1 to 60 atomic % (atomic percent), particularly within the range of 20 to 40 atomic % when the reducing metal atoms are titanium atoms. When the barrier film 4 contains metal atoms of Mo, Ta, Nb, V or Cr in place of Ti atoms, the atomic concentration in the barrier film 4 is preferably within the range of 1 to 30 atomic %, particularly within the range of 5 to 20 atomic %.

The gate electrode 8 consisting of the silicon film 3, the barrier film 4, the metal film 5, the barrier film 6 and the insulator film 7 shown in FIG. 1 is formed through the aforementioned steps. The step of forming the extension regions 21A and 21B, the step of forming the pocket regions 20A and 20B and the high-temperature heat treatment step consisting of the annealing step and the oxidation step may not be carried out in this order but any of six permutations formed by rearranging the order of the three steps may be employed.

When employing Ti as the reducing metal atoms, reductive reaction of the native oxide film 9 is expressed in the following chemical formula:

$$SiO_2 + Ti \rightarrow TiO_2 + Si \qquad (1)$$

Considering that the metal nitride $WN_x$ contained in the barrier film 4p decomposes by the heat treatment, for example, W atoms resulting from decomposition of $WN_x$ in the high-temperature heat treatment partially form the oxide $WO_3$ simultaneously with the reductive reaction of the above formula (1). The absolute values of enthalpies (ΔH) of formation of the oxides $TiO_2$, $SiO_2$ and $WO_3$ are 944 kJ/mol, 911 kJ/mol and 839 kJ/mol respectively. An oxide having a higher absolute value of the enthalpy of formation is higher in thermodynamic stability and hence the reaction of the above formula (1) is dominant in the vicinity of the interface between the barrier film 4p and the silicon film 3p and $SiO_2$ forming the native oxide film 9 can be made to substantially disappear through the high-temperature heat treatment step. Therefore, a material having a higher absolute value of an enthalpy of formation of an oxide than that of an oxide of a semiconductor, such as silicon, forming a gate material is preferably selected as the reducing metal atoms contained in the barrier film 4p.

Figure 18:
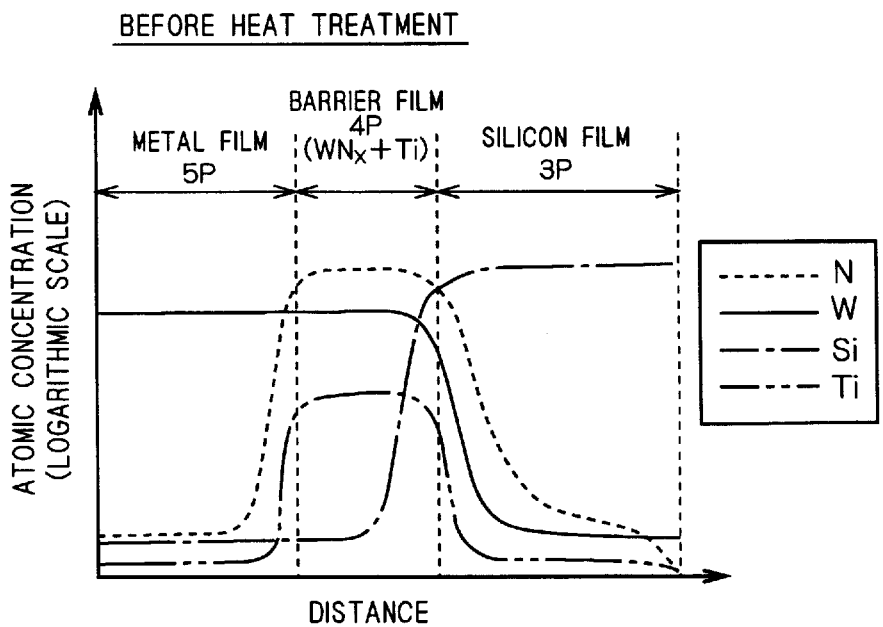
FIG. 18 illustrates concentration distribution of various type s of atoms contained in a metal film, a barrier film and a silicon film forming a gate electrode before heat treatment.
Figure 19:
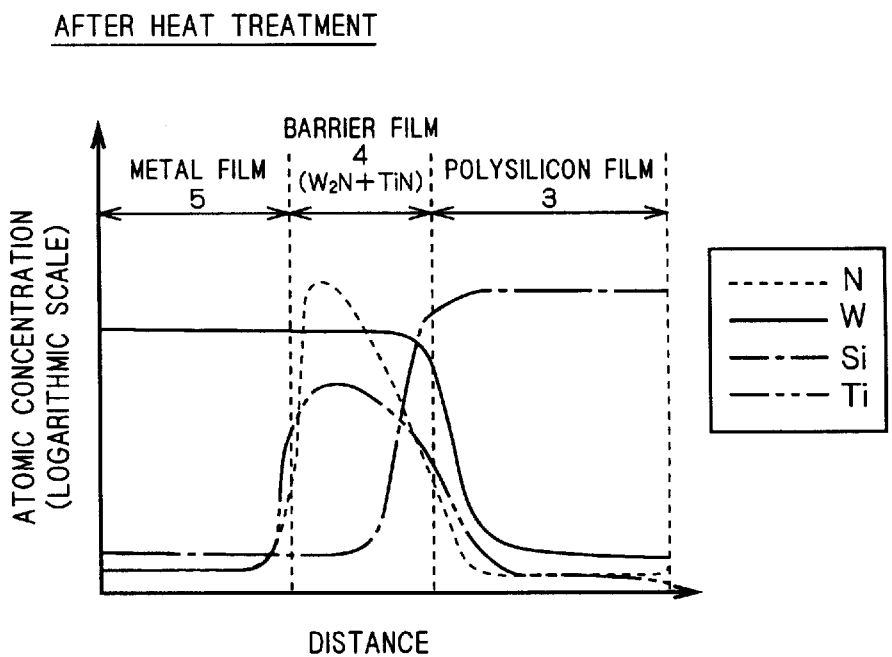
FIG. 19 illustrates concentration distribution of the various types of atoms contained in a metal film, a barrier film and a polysilicon film forming a gate electrode after the heat treatment.

FIGS. 18 and 19 illustrate concentration distribution of the atoms forming the gate electrode 8 before and after the aforementioned high-temperature heat treatment step. FIG. 18 shows exemplary concentration distribution of various types of atoms (N: nitrogen, W: tungsten, Si: silicon and Ti: titanium) contained in the metal film 5p, the barrier film 4p and the silicon film 3p before the aforementioned high-temperature heat treatment step, and FIG. 19 shows concentration distribution of various types of atoms contained in the metal film 5, the barrier film 4 and the silicon film 3 after the high-temperature heat treatment of the gate electrode 8p having the concentration distribution shown in FIG. 18. Referring to each of FIGS. 18 and 19, the horizontal axis shows the distance, and the vertical axis shows the logarithmic scale values of atom numbers per unit cubic centimeter.

As shown in FIG. 18, the N atoms and the Ti atoms are substantially homogeneously distributed over the thickness direction in the barrier film 4p before the high-temperature heat treatment. After the high-temperature heat treatment, on the other hand, the homogeneity of the Ti atoms and the N atoms contained in the barrier film 4 is lost and a distribution curve biased toward the metal film 5 is formed in the barrier film 4. The distribution of the Si atoms is mainly present in the silicon film 3, and the Si atoms are inhibited from diffusing into the barrier film 4 from the silicon film 3.

When tungsten nitride ($WN_x$) contained in the barrier film 4p decomposes by the heat treatment, the N atoms partially escape to the outside air as nitrogen gas ($N_2$). Nitrogen atoms remaining in the gate electrode 8p are transported toward the metal film 5p due to the difference between work functions or chemical potentials of the metal film 5p and the barrier film 4p. Most of the nitrogen atoms transported into the metal film 5p escape to the outside air as nitrogen gas. Ti atoms added to the barrier film 4p are also transported toward the metal film 5p due to the difference between the work functions or chemical potentials of the metal film 5p and the barrier film 4p. As shown in FIG. 19, therefore, the N atoms and the Ti atoms are considered to segregate toward the metal film 5 in the barrier film 4.

In the high-temperature heat treatment step, $WN_x$ contained in the barrier film 4p partially makes transition to $W_2N$ having lower resistance. Further, it is conceivable that silicon atoms are prevented from diffusing into the barrier film 4 from the silicon film 3 since N atoms of $WN_x$ thermally decomposed in an early stage of the high-temperature heat treatment step react with Ti atoms to form a barrier metal (TiN) in the barrier film 4. This Ti—N bonding inhibits the diffusing Si from reacting with W or N, thereby suppressing formation of an insulator such as SiN or WSiN or $WSi_x$ having relatively high resistance. Consequently, it is possible to suppress the sheet resistance and the contact resistance of the gate electrode 8 after the heat treatment.

Figure 20:
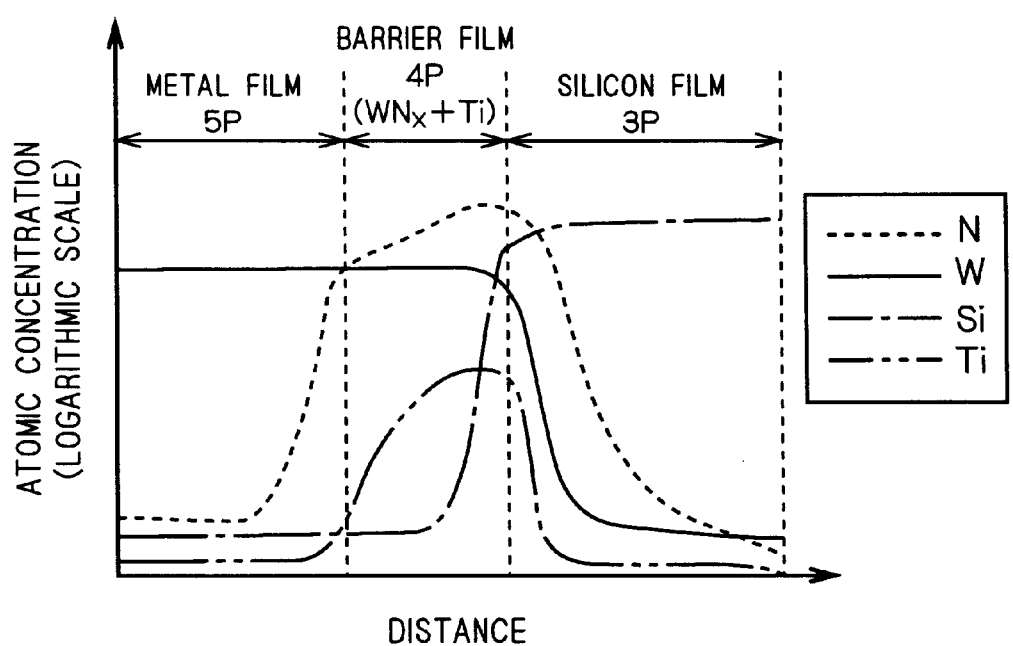
FIG. 20 illustrates concentration distribution of various types of atoms contained in a metal film, a barrier film and a silicon film forming a gate electrode before heat treatment.
Figure 21:
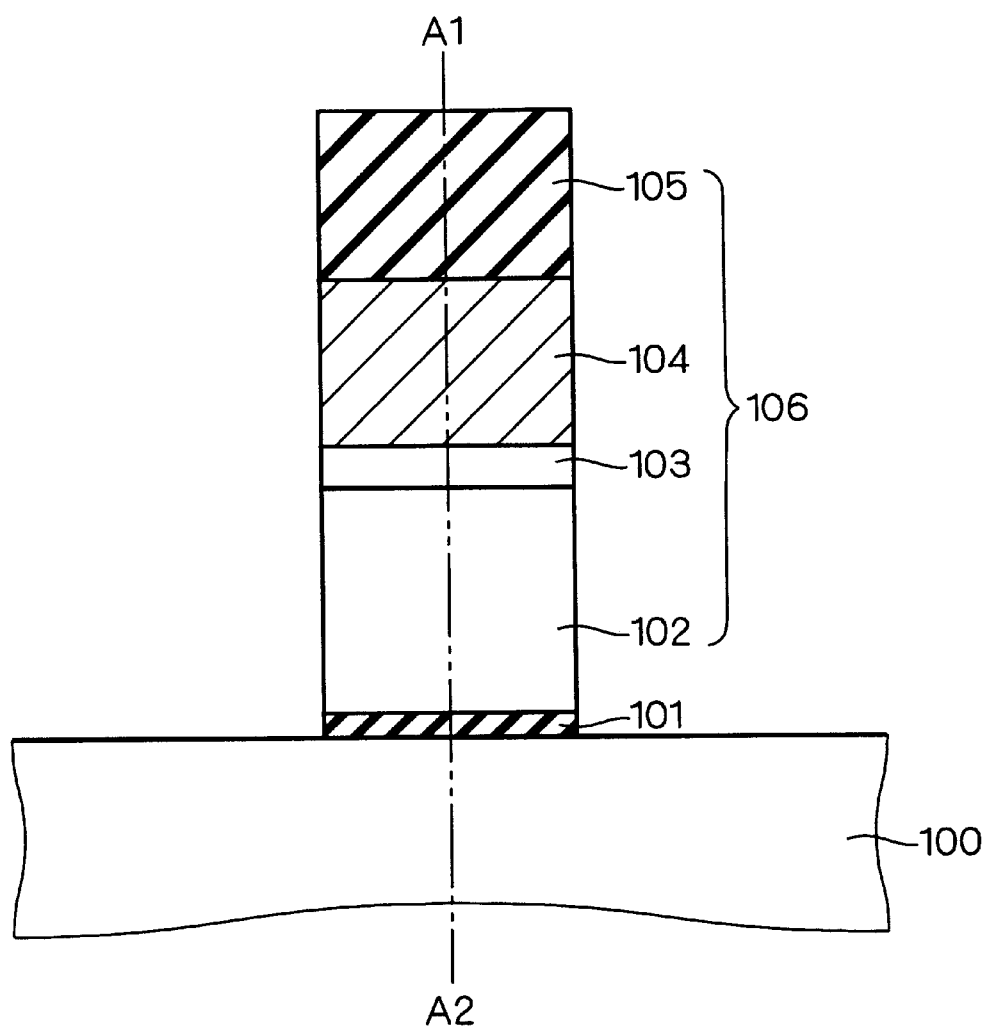
FIG. 21 is a model diagram showing a sectional structure of a gate electrode of a conventional semiconductor device.
Figure 22:
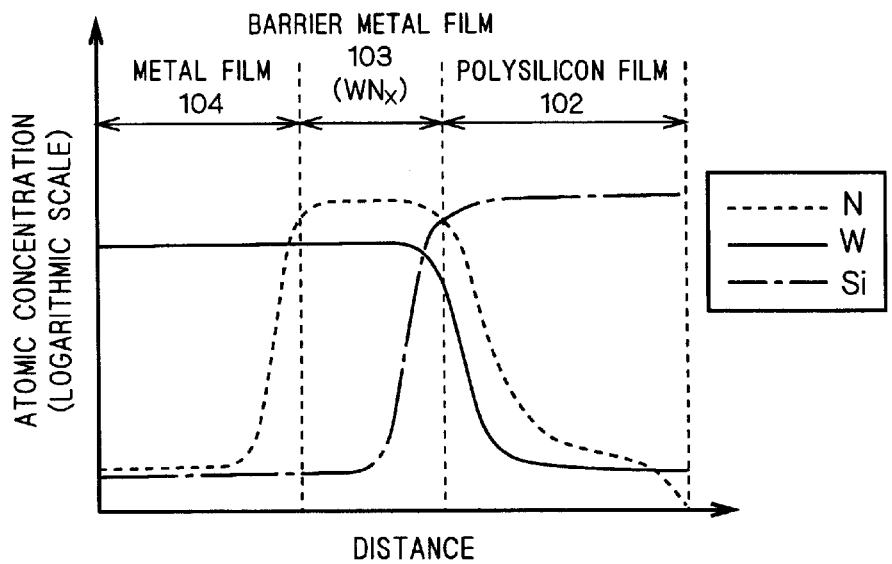
FIG. 22 illustrates concentration distribution of various types of atoms contained in a metal film, a barrier film and a polysilicon film forming the conventional gate electrode before heat treatment.
Figure 23:
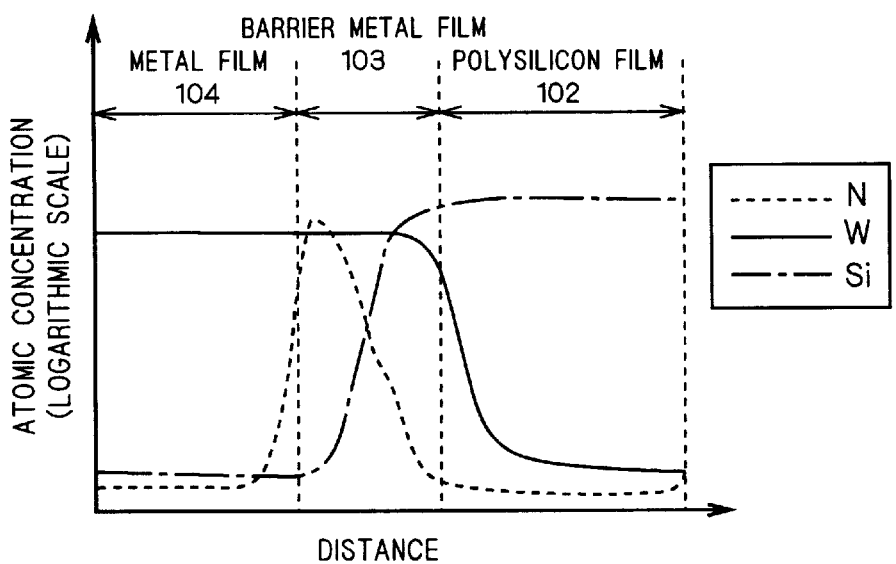
FIG. 23 illustrates concentration distribution of the various types of atoms contained in a metal film, a barrier film and a polysilicon film forming the conventional gate electrode after the heat treatment.

FIG. 20 shows another exemplary concentration distribution of various types of atoms (N, W, Si and Ti) contained in the metal film 5p, the barrier film 4p and the silicon film 3p before the high-temperature heat treatment step. While the concentration distribution of the Ti atoms and the N atoms in the barrier film 4p is substantially homogeneous in the example shown in FIG. 18, the concentrations of the Ti atoms and the N atoms are adjusted to have biased distribution retrograded toward the silicon film 3p in FIG. 20. Thus, the concentration distribution curves of the Ti atoms and the N atoms have peaks in the vicinity of the silicon film 3p in the barrier film 4p, and hence the concentration of the titanium nitride serving as the barrier metal is increased in the barrier film 4 and the performance of the barrier film 4 can be improved when performing the high-temperature heat treatment on the gate electrode 8p having this type of concentration distribution. In order to implement the concentration distribution shown in FIG. 20, a metal nitride film containing no reducing metal atoms (Ti) or a metal nitride film homogeneously containing reducing metal atoms may be formed on the silicon film 3p by a CVD apparatus or a sputtering apparatus for ion-implanting reducing metal atoms and nitrogen atoms into the metal nitride film. The energy for this ion implantation depends on the thickness of the metal nitride film, and the projected range of the implanted ions is so set that the peak of the concentration distribution of the implanted ions is located in the vicinity of the interface between the barrier film 4p and the silicon film 3p. The term "projected range" stands for a length obtained by connecting an incident point and a stop point of the implanted ions with a straight line and projecting the same to the direction of ion implantation.

Figure 8:
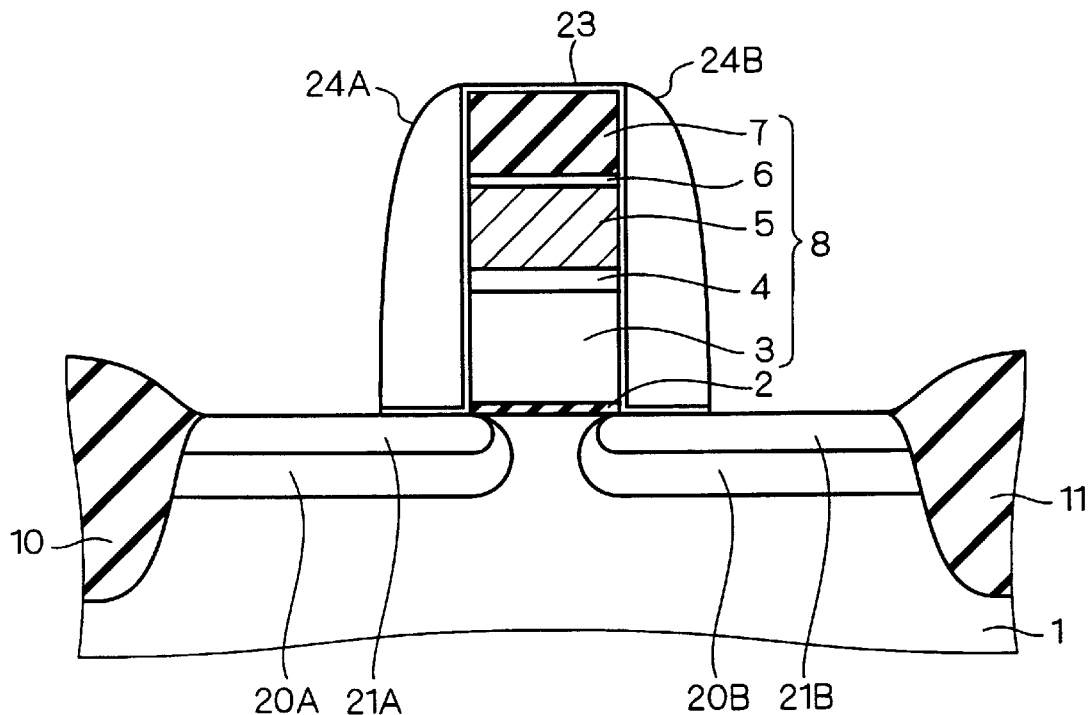

After the gate electrode 8 according to this embodiment is formed in the aforementioned manner, an insulating layer formed by a TEOS (tetraethyl orthosilicate) oxide film or the like is deposited on the oxynitride film 23 formed in the preceding step. Then, anisotropic etching is executed for forming side wall spacers 24A and 24B on both sides of the gate electrode 8 in a self-aligned manner through the oxynitride film 23, as shown in FIG. 8. The insulating layer is not restricted to a single layer but may be formed by a plurality of layers. When formed by a plurality of layers, the insulating layer may have a two-layer structure of SiN and BPSG (borophosphosilicate glass) or SiN and $SiO_2$.

Figure 9:
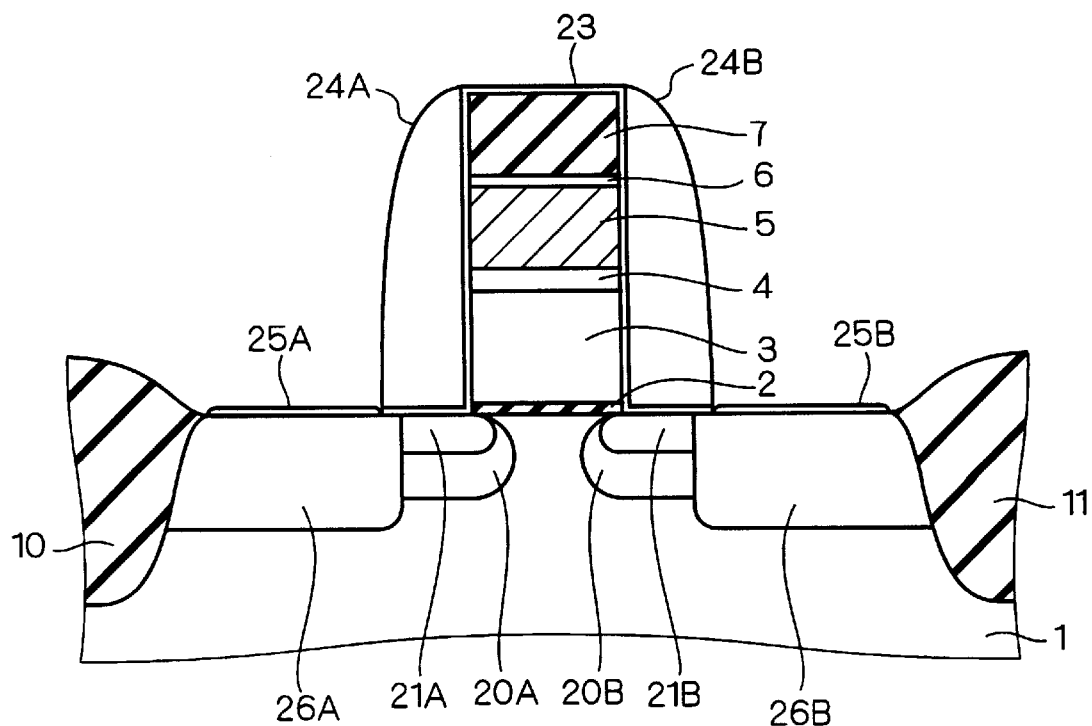

Then, an impurity is ion-implanted into the silicon semiconductor substrate 1 using the gate electrode 8 and the side wall spacers 24A and 24B serving as masks, for forming source/drain diffusion regions 26A and 26B on portions of the silicon semiconductor substrate 1 located on both sides of the gate electrode 8 in a self-alignment manner, as shown in FIG. 9. The impurity may be introduced by the same method as that for forming the aforementioned extension regions 21A and 21B and the pocket regions 20A and 20B. The expression "source/drain" stands for that one of the regions serves as a carrier supply source (source) and the other region serves as a carrier outlet (drain).

Figure 10:
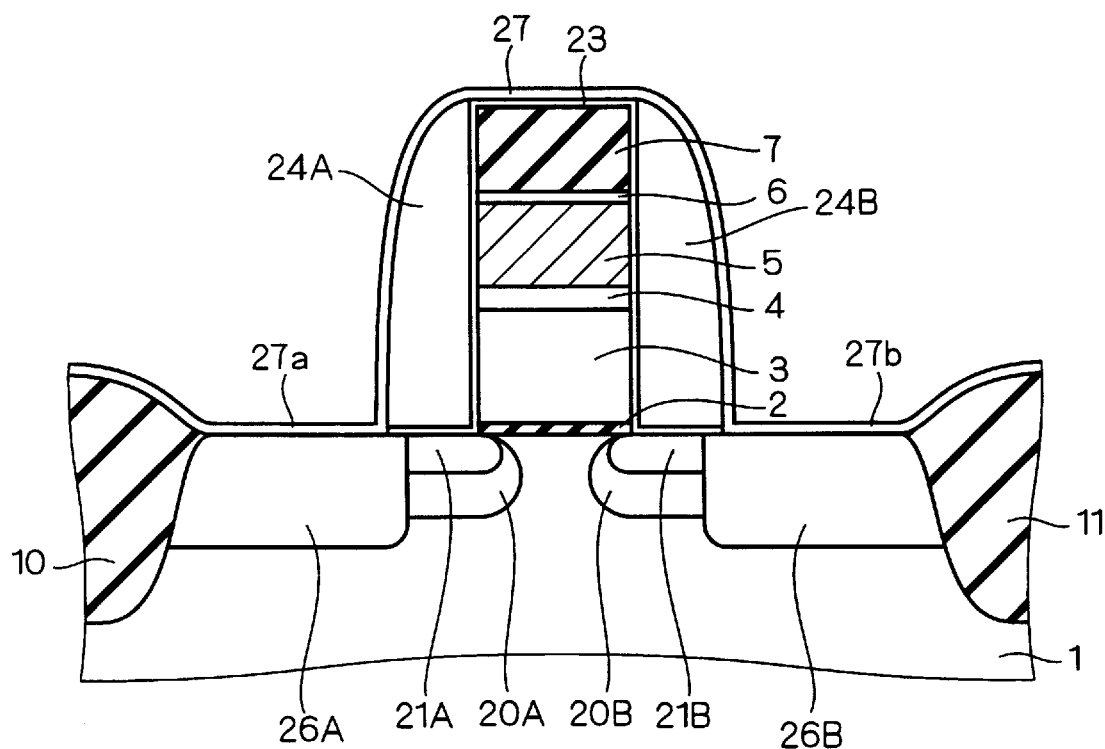

After the side wall spacers 24A and 24B are formed, the surface portions of the silicon semiconductor substrate 1 located on the source/drain diffusion regions 26A and 26B are exposed to the outside air and native oxide films 25A and 25B are formed on these surface portions. Then, the surface portions of the silicon semiconductor substrate 1 are subjected to sputter etching or the like under an argon atmosphere, for example, for removing the native oxide films 25A and 25B, and thereafter a metal film 27 of a high melting point metal such as Co or Ti is deposited on the overall surface as shown in FIG. 10.

Figure 11:
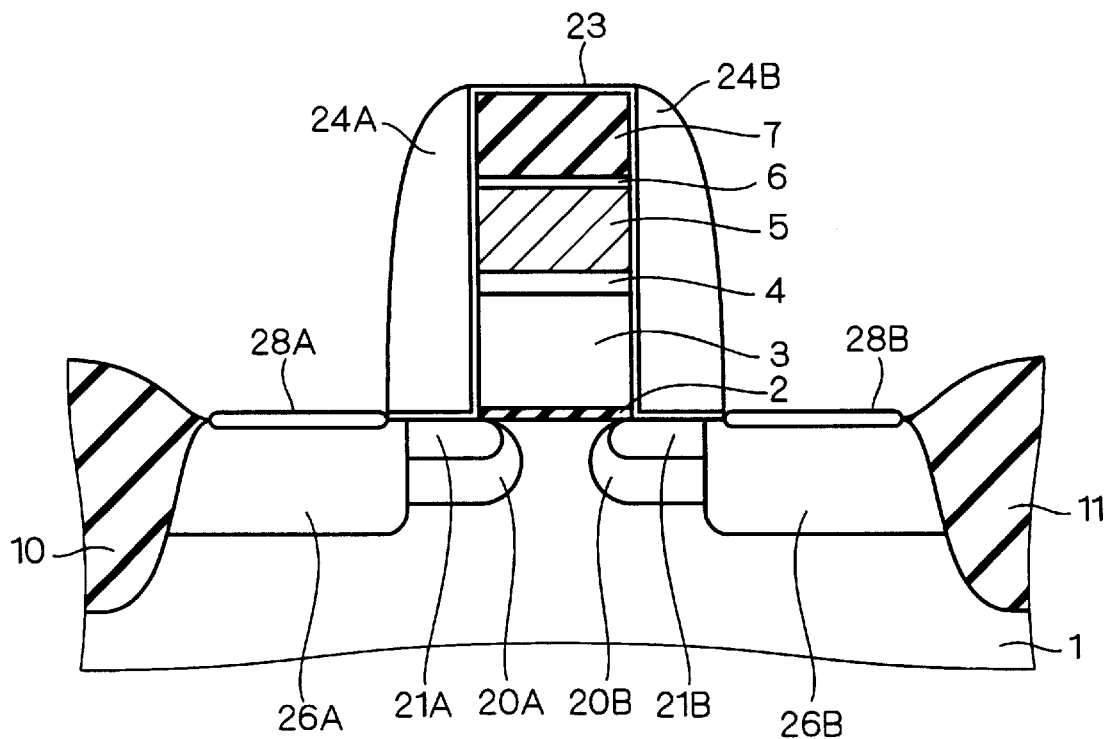

Then, heat treatment such as RTA is executed under an $N_2$ atmosphere, so that metal films 27a and 27b formed on the surfaces of the source/drain diffusion regions 26A and 26B react with silicon contained in the silicon semiconductor substrate 1 and form silicide such as $TiSi_2$ or $CoSi_2$, while a nitride metal film is formed on a portion of the metal film 27 exposed to the $N_2$ atmosphere. Thereafter the nitride metal film is removed by etching, so that silicide layers 28A and 28B of $TiSi_2$ or $CoSi_2$ are formed in the vicinity of the surfaces of the source/drain diffusion regions 26A and 26B, as shown in FIG. 11. When depositing the metal film 27 on the silicon semiconductor substrate 1 without removing the native oxide films 25A and 25B, the silicon semiconductor substrate 1 and the metal film 27 cannot homogeneously react with each other but spiky silicide may be formed or defects may be caused on the interface between the metal film 27 and the silicon semiconductor substrate 1, to increase a leakage current.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising a gate electrode having a layered product of a polysilicon film, a barrier film and a metal film on a semiconductor substrate through a gate insulator film, wherein
    manufacturing steps for said gate electrode comprise steps of:
    (a) forming a polycrystalline or amorphous silicon film on the surface of said semiconductor substrate through said gate insulator film;
    (b) forming said barrier film of a metal nitride containing added reducing metal atoms reducing a silicon oxide film being a native oxide film on said silicon film through said silicon oxide film;
    (c) forming said metal film on said barrier film; and
    (d) executing heat treatment after carrying out said steps (a) to (c).

2. The method of manufacturing a semiconductor device according to claim 1, adding a reducing metal having an enthalpy of formation of an oxide higher than an enthalpy of formation of said silicon oxide film into said barrier film in said step (b).

3. The method of manufacturing a semiconductor device according to claim 1, employing atoms of at least one metal selected from titanium, molybdenum, tantalum, niobium, vanadium and chromium as said reducing metal atoms in said step (b).

4. The method of manufacturing a semiconductor device according to claim 3, employing titanium atoms as said reducing metal atoms and setting the content of said reducing metal atoms in said barrier film within the range of 1 to 60 atomic %.

5. The method of manufacturing a semiconductor device according to claim 3, employing atoms of at least one metal selected from molybdenum, tantalum, niobium, vanadium and chromium as said reducing metal atoms and setting the content of said reducing metal atoms in said barrier film within the range of 1 to 30 atomic %.

6. The method of manufacturing a semiconductor device according to claim 1, employing tungsten nitride as said metal nitride forming said barrier film in said step (b).

7. The method of manufacturing a semiconductor device according to claim 1, depositing said barrier film by sputtering employing a target formed by mosaically arranging a plurality of target materials in said step (b).

8. The method of manufacturing a semiconductor device according to claim 1, introducing argon into said barrier film in said step (b).

9. The method of manufacturing a semiconductor device according to claim 1, introducing said reducing metal atoms and nitrogen atoms into said barrier film to form a peak of concentration distribution in the vicinity of the interface between said barrier film and said silicon film after forming said barrier film in said step (b).

* * * * *